(12) United States Patent
Wu et al.

(10) Patent No.: US 11,178,965 B2
(45) Date of Patent: Nov. 23, 2021

(54) SLIDE RAIL ASSEMBLY

(71) Applicant: HONGFUJIN PRECISION ELECTRONICS (TIANJIN) CO., LTD., Tianjin (CN)

(72) Inventors: Chang-Ju Wu, New Taipei (TW); Chen-Sheng Tang, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/835,636

(22) Filed: Mar. 31, 2020

(65) Prior Publication Data
US 2021/0259414 A1   Aug. 26, 2021

(30) Foreign Application Priority Data

Feb. 21, 2020   (CN) .......................... 202010107838.6

(51) Int. Cl.
*A47B 88/45* (2017.01)
*A47B 88/423* (2017.01)
*H05K 7/14* (2006.01)

(52) U.S. Cl.
CPC ............ *A47B 88/423* (2017.01); *A47B 88/45* (2017.01); *A47B 2088/4235* (2017.01); *H05K 7/1489* (2013.01)

(58) Field of Classification Search
CPC ........ A47B 88/40; A47B 88/423; A47B 88/45
USPC ...................... 312/334.1, 334.8, 334.44, 333
See application file for complete search history.

(56) References Cited

U.S. PATENT DOCUMENTS

| | | | | |
|---|---|---|---|---|
| 4,469,384 A | * | 9/1984 | Fler ....................... | A47B 88/493 312/333 |
| 6,450,600 B1 | * | 9/2002 | Chen ..................... | A47B 88/493 312/333 |
| 6,464,311 B2 | * | 10/2002 | Liang .................... | A47B 88/493 312/333 |
| 6,997,529 B1 | * | 2/2006 | Chen ..................... | A47B 88/493 312/334.44 |
| 7,980,641 B2 | * | 7/2011 | Huang ................... | A47B 88/49 312/334.46 |
| 8,950,834 B2 | * | 2/2015 | Fan ....................... | H05K 7/1489 312/333 |
| 2005/0029913 A1 | * | 2/2005 | He ........................ | A47B 88/427 312/334.44 |
| 2006/0288529 A1 | | 12/2006 | Chen et al. | |
| 2007/0164644 A1 | * | 7/2007 | Hwang .................. | A47B 88/49 312/333 |

(Continued)

FOREIGN PATENT DOCUMENTS

TW             200700036 A        1/2007

*Primary Examiner* — James O Hansen
(74) *Attorney, Agent, or Firm* — ScienBiziP, P.C.

(57) ABSTRACT

A slide rail assembly includes an inner rail, a middle rail slidably coupled to the inner rail, and an outer rail slidably coupled to the middle rail. The inner rail includes a first body and a latching member. The latching member extends from the first body to the middle rail. The middle rail includes a second body and a locking device. The locking device is fixedly coupled to the second body. The locking device defines a latching hole configured to receive the latching member so that the middle rail moves together with the inner rail relative to the outer rail to extend to a designated position and length of the slide rail assembly.

9 Claims, 10 Drawing Sheets

(56) References Cited

U.S. PATENT DOCUMENTS

| | | | | |
|---|---|---|---|---|
| 2008/0303399 A1* | 12/2008 | Huang | ............... | A47B 88/49 312/334.46 |
| 2015/0245709 A1* | 9/2015 | Iwamoto | ............. | A47B 88/40 211/175 |

* cited by examiner

SLIDE RAIL ASSEMBLY

FIELD

The subject matter herein generally relates to slide rail assemblies, and more particularly to a slide rail assembly having a reduced size for use in a cabinet.

BACKGROUND

Slide rail structures generally adopt a ball-bearing structure or a friction-type structure. However, the ball-bearing structure and the friction-type structure have a large thickness.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 1:
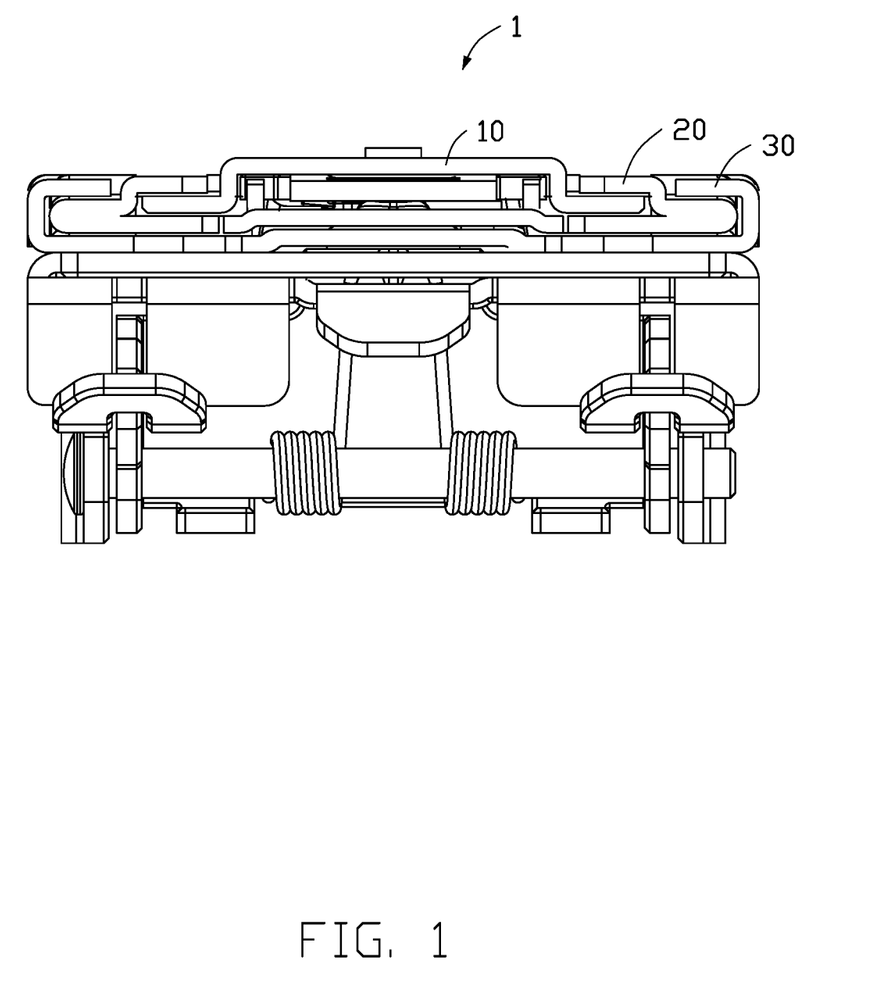
FIG. 1 is a schematic diagram of an embodiment of a slide rail assembly.

FIG. 1 shows an embodiment of a slide rail assembly 1. The slide rail assembly 1 is applicable to a storage device such as a drawer, a server rack, and the like for carrying an object, such as a server. The slide rail assembly 1 includes an inner rail 10, a middle rail 20, and an outer rail 30. The middle rail 20 is slidably connected to the inner rail 10, and the outer rail 30 is slidably connected to the middle rail 20.

Figure 2:
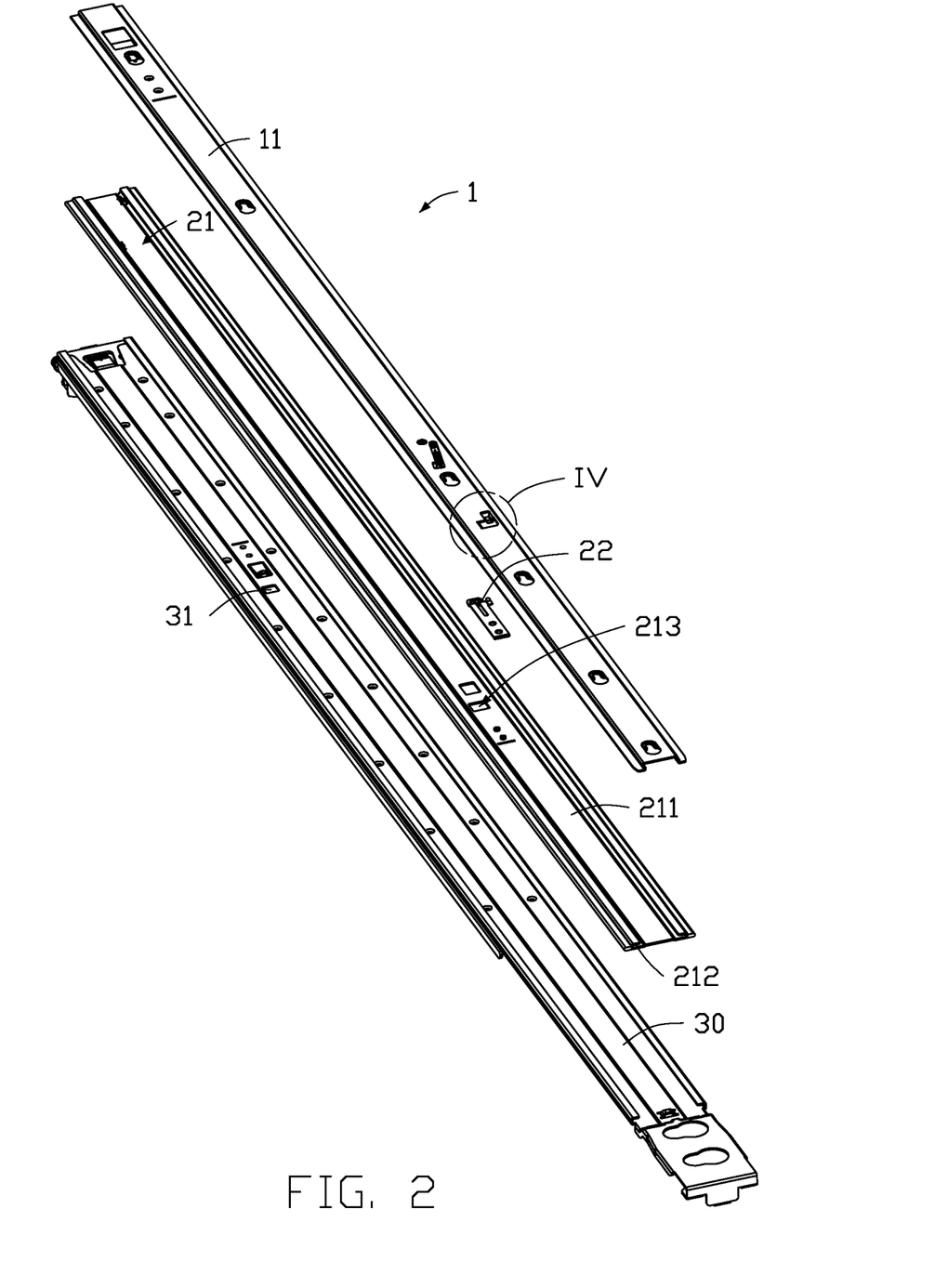
FIG. 2 is an isometric, exploded view of the slide rail assembly in FIG. 1.
Figure 3:
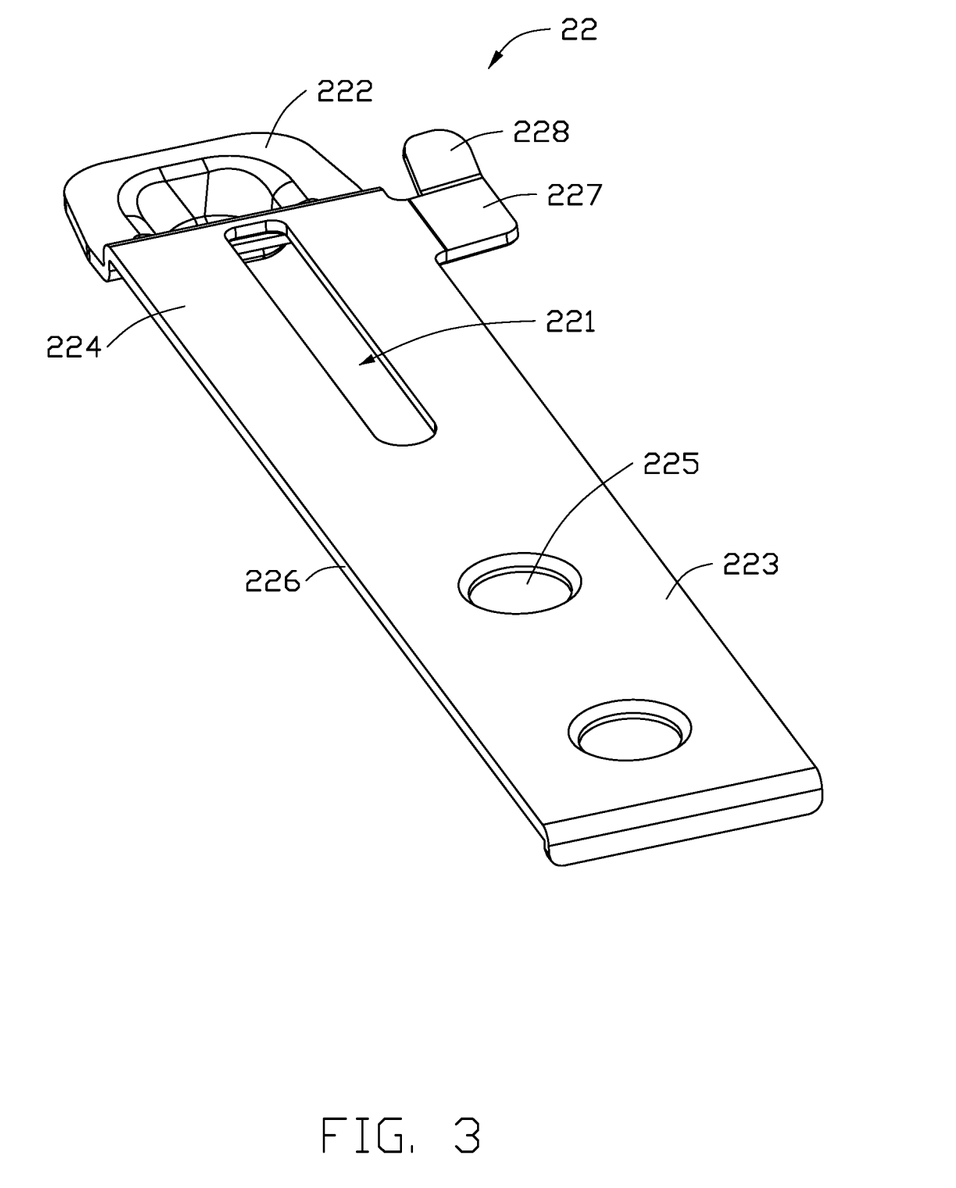
FIG. 3 is an enlarged schematic view of a locking device of the slide rail assembly shown in FIG. 2.
Figure 4:
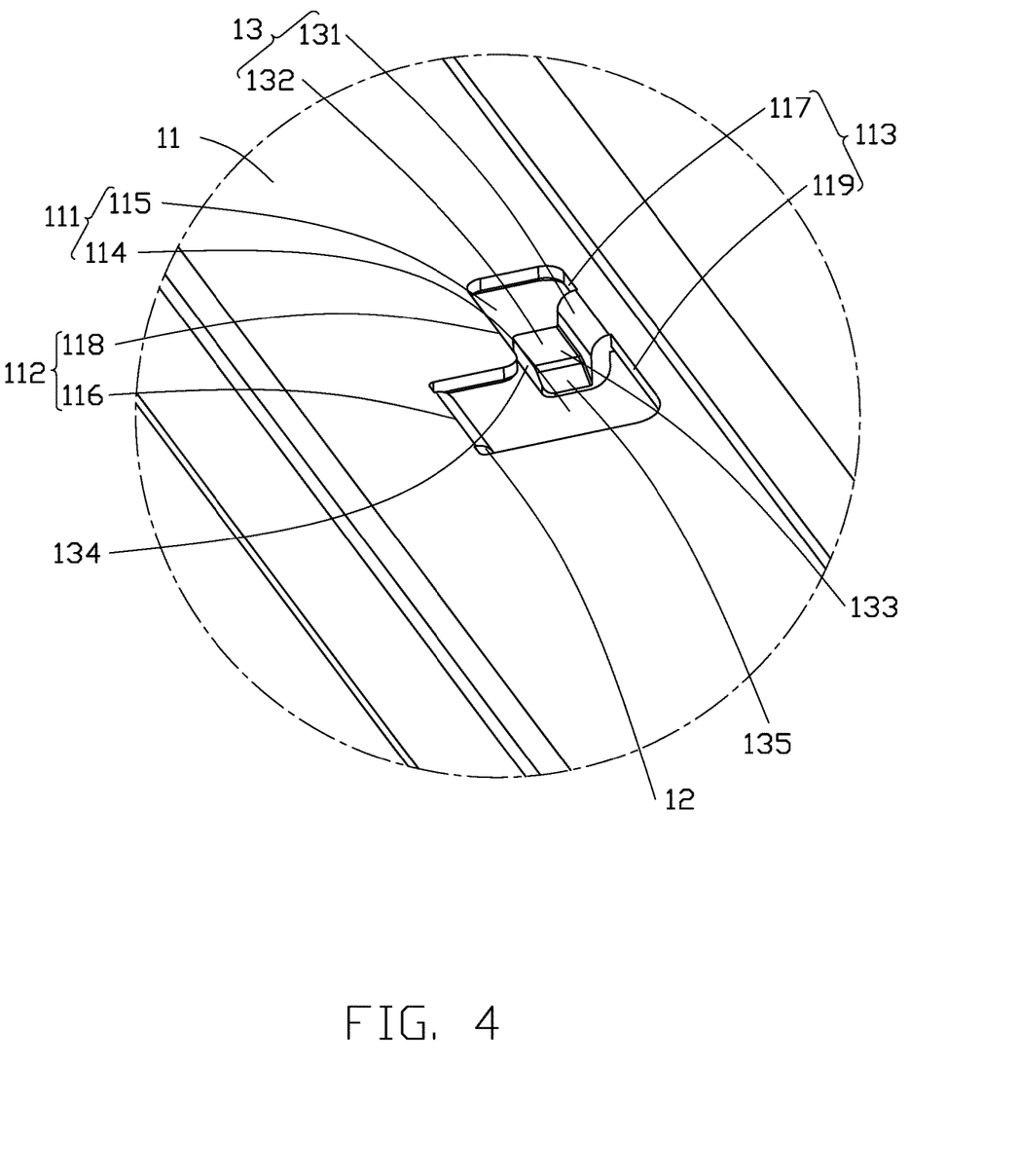
FIG. 4 is a partially enlarged schematic view of circled portion IV shown in FIG. 2.

Referring to FIGS. 2-4, the inner rail 10 includes a first body 11 and a latching member 12. The latching member 12 extends from the first body 11 toward the middle rail 20. The middle rail 20 includes a second body 21 and a locking device 22. The locking device 22 is fixedly connected to the second body 21. A latching hole 221 is defined in the locking device 22. The latching hole 221 is used to receive the latching member 12 so that the inner rail 10 moves the middle rail 20 relative to the outer rail 30 to a designated position to extend a length of the slide rail assembly 1. Since the latching member 12 is received in the latching hole 221, the middle rail 20 moves along with the inner rail 10 relative to the outer rail 30, so that a length of the slide rail assembly 1 at this time is a total superimposed length of the middle rail 20 and the outer rail 30.

The locking device 22 includes a locking head 222, and the outer rail 30 defines a locking hole 31. The locking hole 31 is used to receive a portion of the locking head 222 that passes through the second body 21, so that the outer rail 30 limits movement of the middle rail 20, and the latching member 12 detaches from the latching hole 221. Thus, the inner rail 10 detaches from the middle rail 20, so that the inner rail 10 can continue to move relative to the middle rail 20, and the length of the slide rail assembly 1 at this time is a combined superimposed length of the inner rail 10, the middle rail 20, and the outer rail 30.

The second body 21 includes a first surface 211 and a second surface 212. The second surface 212 and the first surface 211 are opposite surfaces of the second body 21. The first surface 211 faces the inner rail 10, and the second surface 212 faces the outer rail 30. The second body 21 defines a through hole 213 passing through the first surface 211 and the second surface 212. The locking device 22 is fixedly connected to the first surface 211 of the second body 21. The locking hole 31 is used for receiving the portion of the locking head 222 passing through the through hole 213. Therefore, the locking head 222 can be received in the locking hole 31 of the outer rail 30 through the through hole 213.

In one embodiment, the locking device 22 is made of an elastic material. A first end portion 223 of the locking device 22 is fixedly connected to the second body 21, and a second end portion 224 of the locking device 22 includes the locking head 222. The locking head 222 of the locking device 22 abuts against the outer rail 30 so that the second end portion 224 of the locking device 22 is deformed until the locking hole 31 receives the locking head 222. When the locking head 222 of the locking device 22 is not received in the locking hole 31, because the locking head 222 abuts against the outer rail 30, a distance between the second end portion 224 and the second body 21 is increased, the second end portion 224 is deformed, and the locking head 222 resists against the outer rail 30. When the locking device 22 moves to the locking hole 31, the locking head 222 resisting against the outer rail 30 is received in the locking hole 31, and the second end portion 224 of the locking device 22 is restored. Therefore, at this time, the latching member 12 can separate from the latching hole 221. In one embodiment, a positioning hole 225 is defined in the locking device 22, and the slide rail assembly 1 includes a positioning member (not shown). The positioning member passes through the positioning hole 225 to enter the second body 21, so that the locking device 22 is fixedly connected to the first surface 211 of the second body 21.

In one embodiment, the inner rail 10 further includes a hook 13, and the locking device 22 includes a base plate 226 and a locking member 227. A first end of the base plate 226 is fixedly connected to the second body 21. A second end of the base plate 226 includes the locking head 222. The locking member 227 extends from a side of the base plate 226 in a direction away from the base plate 226. The locking member 227 is configured to engage with the hook 13 to remove the locking head 222 from the locking hole 31. Then, the middle rail 20 can move together with the inner rail 10.

The base plate 226 defines the latching hole 221 between the first end of the base plate 226 and the locking head 222. If the locking head 222 is not received in the locking hole 31, the second end portion 224 of the locking device 22 is deformed toward the inner rail 10, so that the latching member 12 of the inner rail 10 can be received in the latching hole 221. When the locking head 222 is received in the locking hole 31, the second end portion 224 of the locking device 22 is elastically restored, so that the latching member 12 is removed from the latching hole 221.

In one embodiment, a receiving hole 111 is defined in the first body 11. The latching member 12 extends from a first side 112 of the receiving hole 111 toward the middle rail 20. The hook 13 extends from a second side 113 of the receiving hole 111 toward the first side 112. The second side 113 is opposite to the first side 112. Therefore, a portion of the second end portion 224 connected to the locking member 227 can pass through the receiving hole 111, so that the hook 13 can engage with the locking member 227, and the latching member 12 can engage with the latching hole 221. In one embodiment, the receiving hole 111 is substantially L-shaped.

In one embodiment, the receiving hole 111 includes a first hole portion 114 and a second hole portion 115. The first hole portion 114 is in communication with the second hole portion 115. The first body 11 forms a first edge 116 at the first hole portion 114 and forms a second edge 118 at the second hole portion 115. The first edge 116 and the second edge 118 are on the first side 112 of the receiving hole 111. The first body 11 forms a third edge 117 at the second hole portion 115 and forms a fourth edge 119 at the first hole portion 114. The third edge 117 and the fourth edge 119 are on the second side 113 of the receiving hole 111. The latching member 12 is connected to the first edge 116. The hook 13 is connected to the third edge 117. The third edge 117 is opposite to the second edge 118. The third edge 117 is coplanar with the fourth edge 119. The first edge 116 is opposite to the fourth edge 119.

In one embodiment, the hook 13 includes a perpendicular plate 131 and a parallel plate 132. The perpendicular plate 131 extends from the third edge 117 to the middle rail 20, and the parallel plate 132 extends from the perpendicular plate 131 toward the latching member 12.

In one embodiment, the parallel plate 132 includes a first surface 133 and a second surface 134. The first surface 133 and the second surface 134 are opposite surfaces of the parallel plate 132. An end of the parallel plate 132 adjacent to the latching member 12 forms an inclined surface 135 between the first surface 133 and the second surface 134. A side of the locking member 227 adjacent to the locking head 222 includes an inclined plate 228 extending away from the second body 21. The inclined plate 228 is configured to engage with the inclined surface 135 to guide the locking member 227 onto the parallel plate 132.

A working process of the slide rail assembly 1 will be described in detail below.

Figure 5:
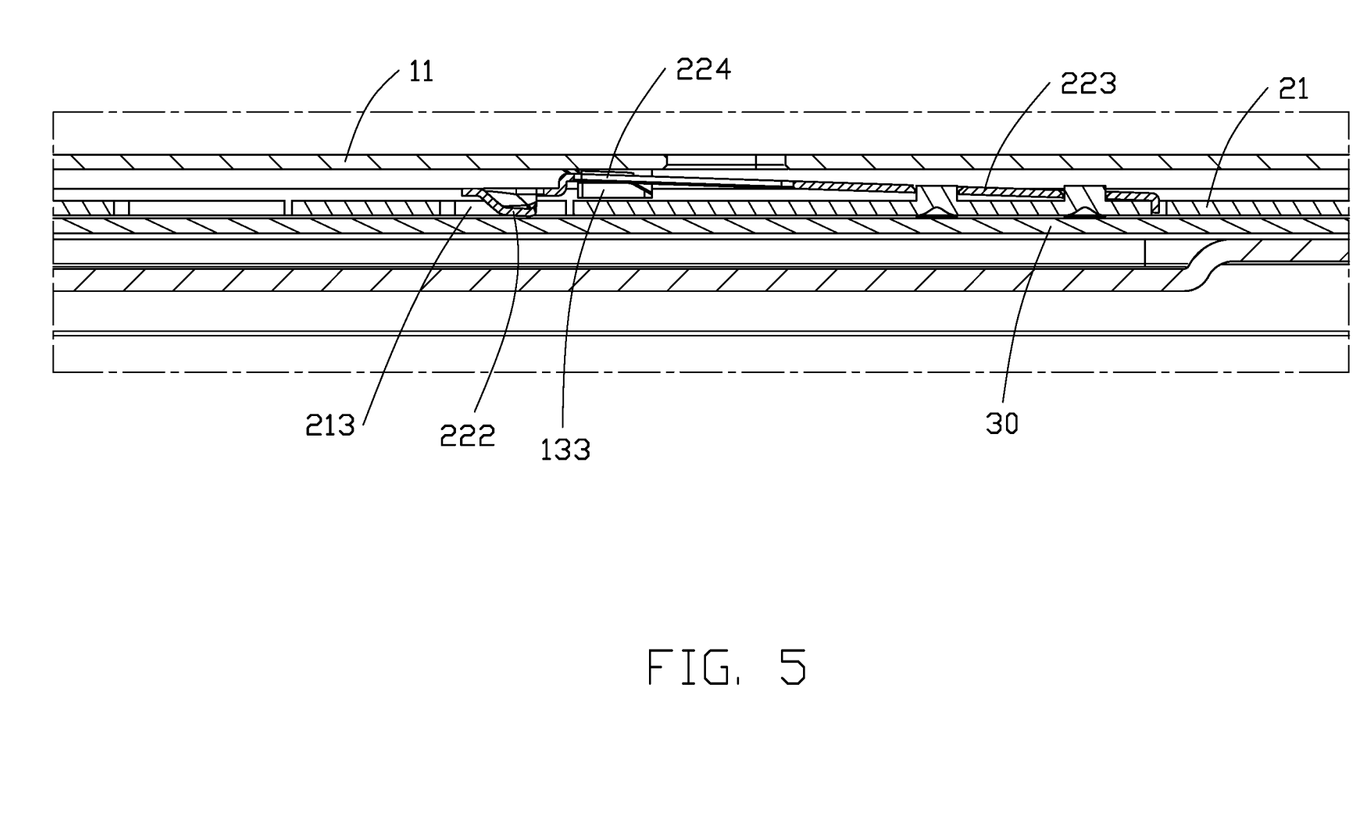
FIG. 5 is a schematic cross-sectional view of an initial state of the slide rail assembly.
Figure 6:
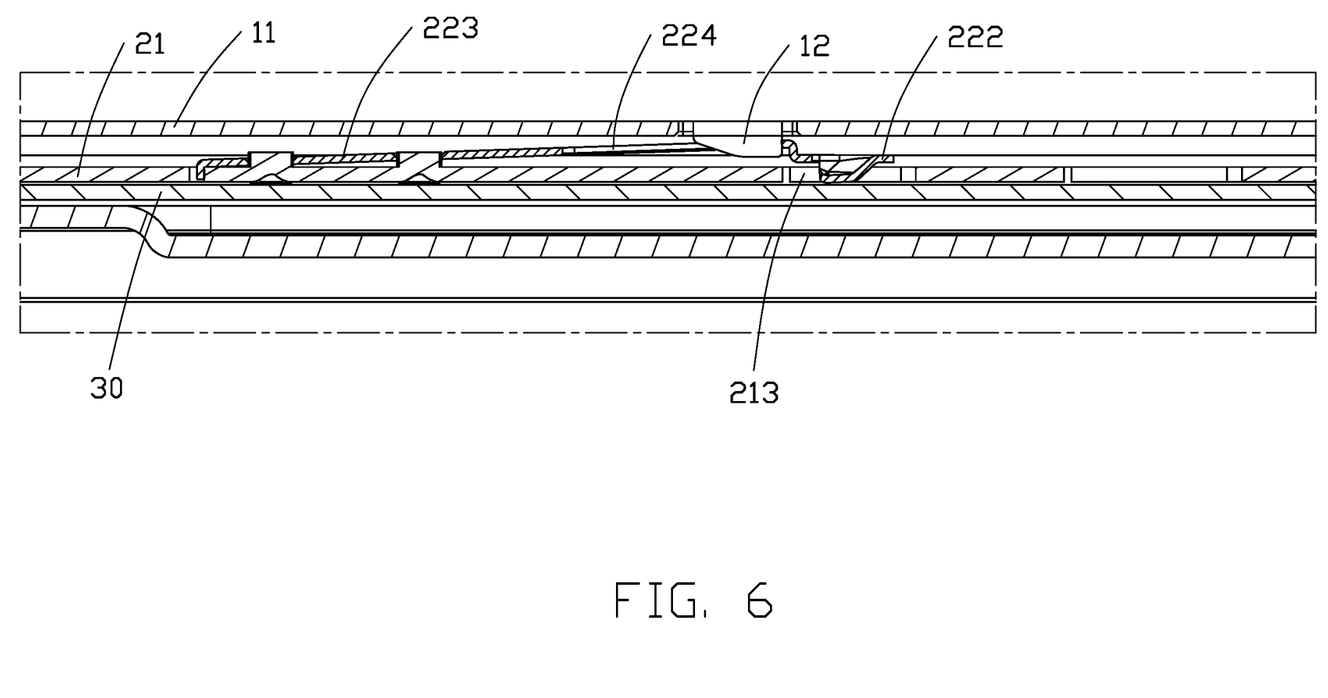
FIG. 6 is a schematic cross-sectional view of a second state of the slide rail assembly during an extending process of the slide rail assembly.
Figure 7:
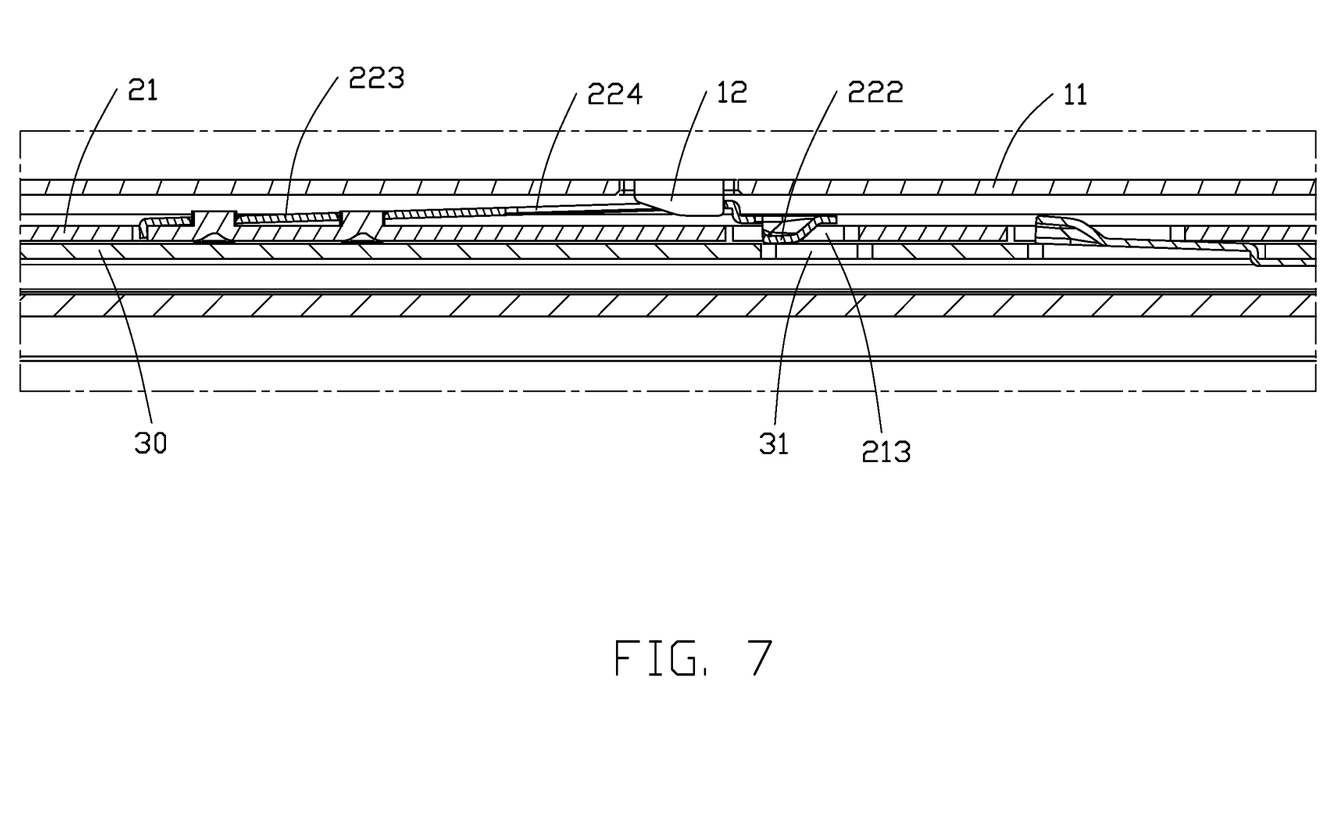
FIG. 7 is a schematic cross-sectional view of a third state of the slide rail assembly during the extending process of the slide rail assembly.
Figure 8:
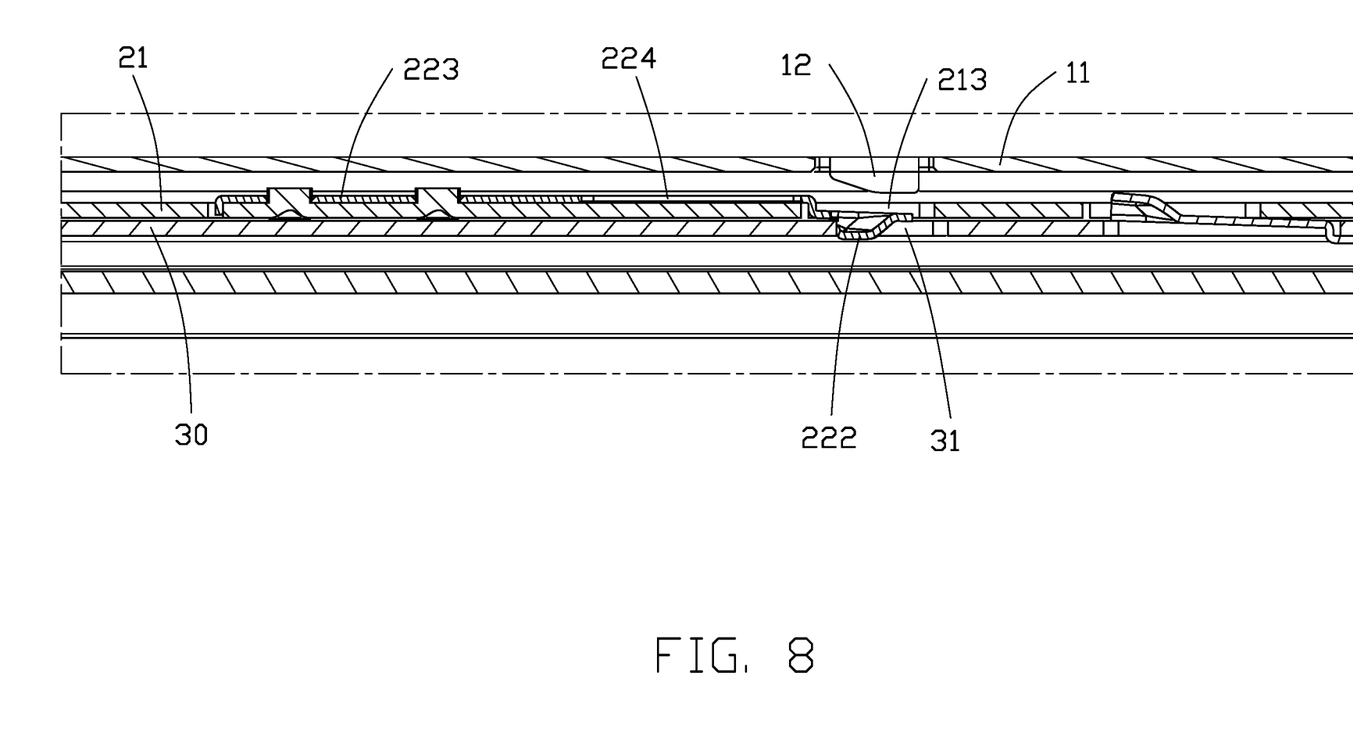
FIG. 8 is a schematic cross-sectional view of a fourth state of the slide rail assembly during the extending process of the slide rail assembly.

To extend the slide rail assembly 1, as shown in FIG. 5 in an initial state, the locking member 227 is located on the parallel plate 132. The locking head 222 abuts against the outer rail 30 to deform the second end portion 224 of the locking device 22 away from the second body 21, and the locking head 222 resists against the outer rail 30. Then, the inner rail 10 is moved in a first direction, and the hook 13 of the inner rail 10 moves away from the locking member 227 until the hook 13 is released from the locking member 227. At this time, the distance between the second end portion 224 of the locking device 22 and the second body 21 is reduced, and the latching member 12 is received in the latching hole 221 (shown in FIG. 6) to link the inner rail 10 and the middle rail 20. The inner rail 10 drives the middle rail 20 to move relative to the outer rail 30 until the locking head 222 moves to the locking hole 31 (shown in FIG. 7). When the locking head 222 is aligned with the locking hole 31, the second end portion 224 of the locking device 22 is elastically restored to cause the locking head 222 to be received in the locking hole 31. At this time, the latching member 12 can be removed from the latching hole 221 (as shown in FIG. 8) to unlink the inner rail 10 and the middle rail 20. Then, the inner rail 10 can continue to move to extend the length of the slide rail assembly 1.

Figure 9:
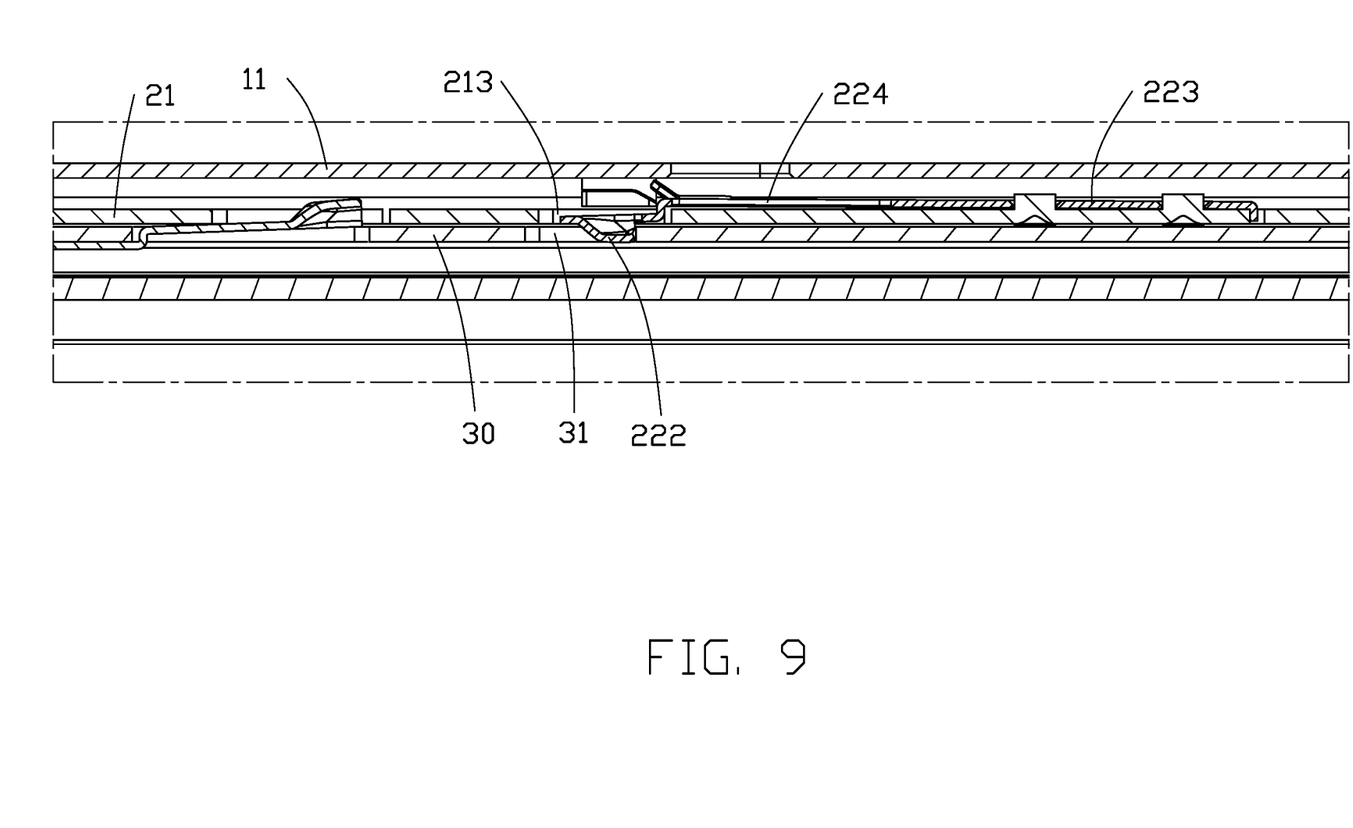
FIG. 9 is a schematic cross-sectional view of a fifth state of the slide rail assembly during a retracting process of the slide rail assembly.
Figure 10:
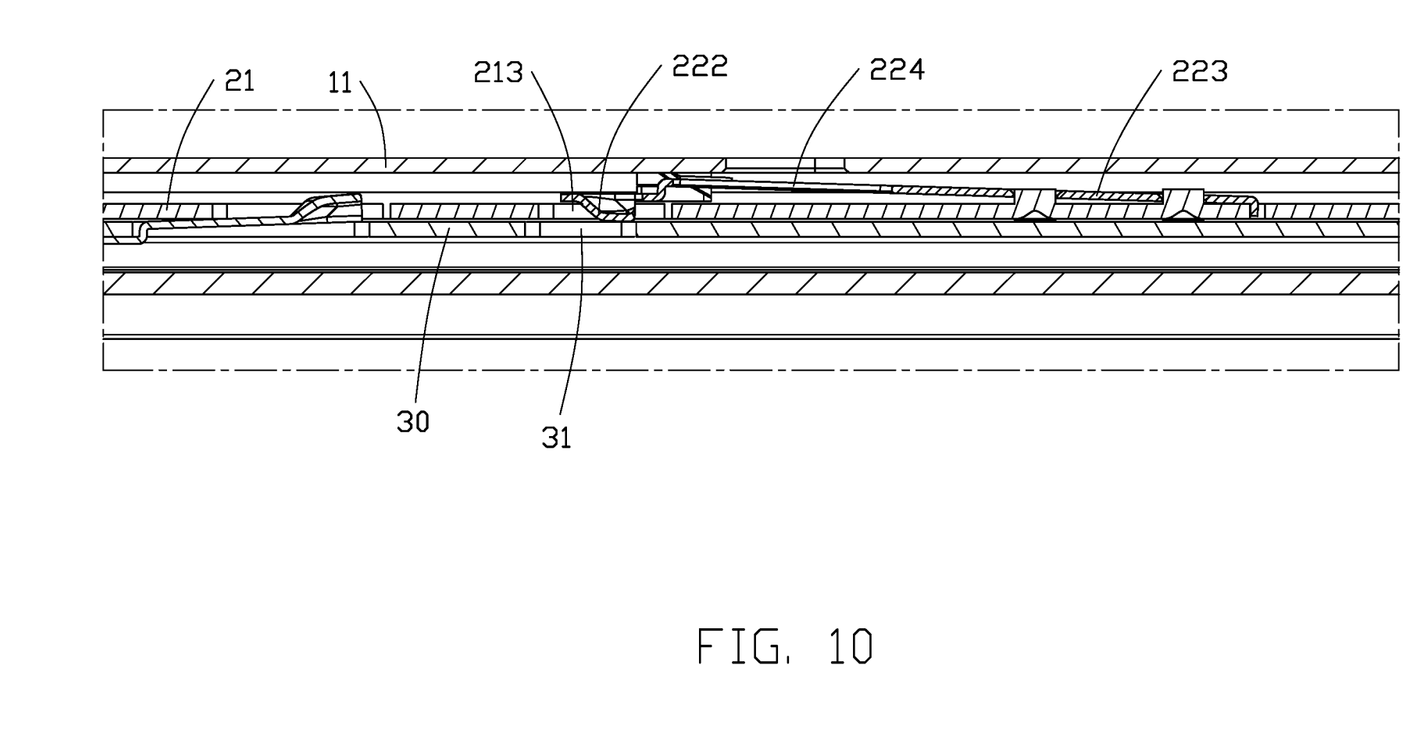
FIG. 10 is a schematic cross-sectional view of a sixth state of the slide rail assembly during the retracting process of the slide rail assembly.

To shorten the slide rail assembly 1, as shown in FIG. 9, the inner rail 10 is moved in a second direction opposite the first direction. The inclined surface 135 of the inner rail 10 and the inclined plate 228 of the locking member 227 guide the locking member 227 to move onto the parallel plate 132. At this time, the locking head 222 is removed from the locking hole 31 (as shown in FIG. 10). The locking member 227 continues to move to the initial position on the parallel plate 132, and the locking head 222 resists against the outer rail 30, thereby deforming the second end portion 224 of the locking device 22 away from the second body 21. The locking head 222 resists against the outer rail 30 until the inner rail 10 is aligned with the middle rail 20. At this time, the inner rail 10 can drive the middle rail 20 to move to the initial position by an auxiliary device on a side of the inner rail 10.

A structure of the slide rail assembly 1 is compact and has a smaller thickness than slide rail assemblies in the related art.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A slide rail assembly comprising:
an inner rail;
a middle rail slidably coupled to the inner rail; and
an outer rail slidably coupled to the middle rail; wherein:
the inner rail comprises a first body and a latching member, the latching member extending from the first body toward the middle rail;
the middle rail comprises a second body and a locking device, the locking device fixedly coupled to the second body; and
the locking device defines a latching hole configured to receive the latching member so that the middle rail moves together with the inner rail relative to the outer rail to extend to a designated position and length of the slide rail assembly;
the locking device comprises a locking head; and
the outer rail defines a locking hole configured to receive a portion of the locking head passing through the second body to limit a movement of the middle rail and to remove the latching member from the latching hole.

2. The slide rail assembly of claim 1, wherein:
the second body comprises a first surface and a second surface;
the first surface and the second surface of the second body are opposite surfaces of the second body;
the first surface of the second body faces the inner rail;
the second surface of the second body faces the outer rail;
the second body defines a through hole passing through the first surface and the second surface;
the locking device is fixedly coupled to the first surface of the second body; and
the locking hole is configured to receive the portion of the locking head passing through the through hole.

3. The slide rail assembly of claim 2, wherein:
the locking device is made of an elastic material;
a first end portion of the locking device is fixedly coupled to the second body;
the locking head is located on a second end portion of the locking device; and
the locking head resisting against the outer rail deforms the second end portion of the locking device until the locking head is received in the locking hole.

4. The slide rail assembly of claim 1, wherein:
the locking device is made of an elastic material;
the inner rail further comprises a hook;
the locking device further comprises a base plate and a locking member;
a first end of the base plate is fixedly coupled to the second body;
the locking head is located on a second end of the base plate;
the locking member extends from a side of the base plate in a direction away from the base plate;
the locking head resisting against the outer rail deforms the second end of the base plate until the locking head is received in the locking hole; and
the locking member is configured to engage with the hook to remove the locking head from the locking hole.

5. The slide rail assembly of claim 4, wherein:
the base plate defines the latching hole between the first end and the locking head of the base plate.

6. The slide rail assembly of claim 4, wherein:
the first body defines a receiving hole;
the latching member extends from a first side of the receiving hole toward the middle rail;
the hook extends from a second side of the receiving hole toward the first side; and
the second side is opposite to the first side.

7. The slide rail assembly of claim 6, wherein:
the receiving hole comprises a first hole portion and a second hole portion in communication with the first hole portion;
the latching member is located in the first hole portion;
the hook is located in the second hole portion; and
an edge of the first body on the first side of the second hole portion is opposite an edge of the first body on the second side of the second hole portion.

8. The slide rail assembly of claim 4, wherein:
the hook comprises a perpendicular plate and a parallel plate;
the perpendicular plate extends from the first body toward the middle rail; and
the parallel plate extends from the perpendicular plate toward the latching member.

9. The slide rail assembly of claim 8, wherein:
the parallel plate comprises a first surface and a second surface;
the first surface and the second surface of the parallel plate are opposite surfaces of the parallel plate;
an end of the parallel plate adjacent to the latching member forms an inclined surface between the first surface and the second surface of the parallel plate;
a side of the locking member adjacent to the locking head comprises an inclined plate extending, away from the second body; and
the inclined plate is configured to engage with the inclined surface to guide the locking member onto the parallel plate.

* * * * *